(12) United States Patent
Khazhinsky et al.

(10) Patent No.: US 7,817,387 B2
(45) Date of Patent: Oct. 19, 2010

(54) MIGFET CIRCUIT WITH ESD PROTECTION

(75) Inventors: Michael G. Khazhinsky, Austin, TX (US); Leo Mathew, Austin, TX (US); James W. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 331 days.

(21) Appl. No.: 11/971,591

(22) Filed: Jan. 9, 2008

(65) Prior Publication Data

US 2009/0174973 A1    Jul. 9, 2009

(51) Int. Cl.
*H02H 9/00* (2006.01)
*H01L 23/62* (2006.01)

(52) U.S. Cl. .......................................... 361/56; 257/355

(58) Field of Classification Search .................... 361/56; 257/355, 438, 439
See application file for complete search history.

(56) References Cited

U.S. PATENT DOCUMENTS

| | | | |
|---|---|---|---|
| 4,385,337 A | 5/1983 | Asano et al. |
| 5,034,845 A | 7/1991 | Murakami |
| 5,237,395 A | 8/1993 | Lee |
| 5,239,440 A | 8/1993 | Merrill |
| 5,255,146 A | 10/1993 | Miller |
| 5,287,241 A | 2/1994 | Puar |
| 5,311,391 A | 5/1994 | Dungan et al. |
| 5,361,185 A | 11/1994 | Yu |
| 5,440,162 A | 8/1995 | Worley et al. |
| 5,515,232 A | 5/1996 | Fukazawa et al. |
| 5,559,659 A | 9/1996 | Strauss |
| 5,610,790 A | 3/1997 | Staab et al. |
| 5,654,862 A | 8/1997 | Worley et al. |
| 5,946,177 A | 8/1999 | Miller et al. |

(Continued)

FOREIGN PATENT DOCUMENTS

JP    2007-053316    3/2007

OTHER PUBLICATIONS

W.D. Mack and R.G. Meyer, "New ESD Protection Schemes for BiCMOS Processes with Application to Cellular Radio Designs," ISCAS Proceedings 1992.

(Continued)

*Primary Examiner*—Jared Fureman
*Assistant Examiner*—Lucy Thomas
(74) *Attorney, Agent, or Firm*—James L. Clingan, Jr.; Ranjeev Singh

(57) ABSTRACT

An electrostatic discharge (ESD) protected circuit is coupled to a power supply voltage rail and includes a multiple independent gate field effect transistor (MIGFET), a pre-driver, and a hot gate bias circuit. The MIGFET has a source/drain path coupled between an output pad and the power supply voltage rail and has a first gate terminal and a second gate terminal. The pre-driver circuit has an output. The hot gate bias circuit is coupled to the first gate terminal of the MIGFET, and the output of the pre-driver circuit is coupled to the second gate terminal of the MIGFET. The hot gate bias circuit is configured to apply a bias voltage to the first gate terminal of the MIGFET during an ESD event that increases the breakdown voltage of the MIGFET so as to better withstand the ESD event.

18 Claims, 3 Drawing Sheets

U.S. PATENT DOCUMENTS

| | | | |
|---|---|---|---|
| 6,310,466 B1 * | 10/2001 | Criscione | 323/222 |
| 6,385,021 B1 | 5/2002 | Takeda et al. | |
| 6,724,603 B2 | 4/2004 | Miller et al. | |
| 6,879,476 B2 | 4/2005 | Khazhinsky et al. | |
| 7,244,640 B2 | 7/2007 | Yang et al. | |
| 7,301,741 B2 | 11/2007 | Khazhinsky et al. | |
| 2003/0151077 A1 | 8/2003 | Mathew et al. | |
| 2004/0109270 A1 * | 6/2004 | Stockinger et al. | 361/56 |
| 2004/0219722 A1 | 11/2004 | Pham et al. | |
| 2006/0262469 A1 | 11/2006 | Khazhinsky et al. | |
| 2007/0025034 A1 | 2/2007 | Chaudhary et al. | |

OTHER PUBLICATIONS

R. Merrill and E. Issaq, "ESD Design Methodology," Proc. EOS/ESD Symposium, pp. 233-237, 1993.

S. Dabral, R. Aslett, and T. Maloney, "Core Clamps for Low Voltage Technologies," EOS/ESD Symp. Proceedings, 1994.

E. R. Worley, R. Gupta, B. Jones, R. Kjar, C. Nguyen, and M. Tennyson, "Sub-micron Chip ESD Protection Schemes which Avoid Avalanching Junctions," Proc. EOS/ESD Symposium, pp. 13-20, 1995.

G. Croft, "Transient Supply Clamp with a Variable RC Time Constant," EOS/ESD Symp. Proceedings, 1996, pp. 276-279.

W. Anderson, J. Montanaro and N. Howorth, "Cross-Referenced EDS Protection for Power Supplies," EOS/ESD Symp. Proceedings, 1998.

J.C. Bernier, G.D. Croft, and W.R. Young, "A Process Independent ESD Design Methodology," ISCAS Proceedings, 1999.

P. Juliano and W. Anderson, "ESD Protection Design Challenges for a High Pin-Count Alpha Microprocessor in a 0.13um CMOS SOI Technology," EOS/ESD Symp. Proceedings, 2003.

Khazhinsky, M.G., Miller, J.W., Stockinger, M., Weldon, J.C., "Engineering Single NMOS and PMOS Output Buffers for Maximum Failure Voltage in Advanced CMOS Technologies," in Proc. EOS/ESD Symp., pp. 255-264, 2004.

M. Stockinger, J. W. Miller, M. G. Khazhinsky, C. A. Torres, J. C. Weldon, B. D. Preble, M. J. Bayer, M. Akers, and V. G. Kamat, "Boosted and Distributed Rail Clamp Networks for ESD protection in Advanced CMOS Technologies," in Proc. EOS/ESD Symp., pp. 17-26, 2003.

C. Torres, J. Miller, M. Stockinger, M. Akers, M. Khazhinsky and J. Weldon, "Modular, Portable and Easily Simulated ESD Protection Networks for Advanced CMOS Technologies," EOS/ESD Symp. Proceedings, 2001.

PCT/US2008/086180 International Search Report and Written Opinion mailed Jun. 24, 2009.

* cited by examiner ovided a logic high to control gate 24 thereby ensuring that MIGFET 14 is made conductive during the ESD event with a gate to source bias that is at or near the same voltage that is applied between the drain and

MIGFET CIRCUIT WITH ESD PROTECTION

BACKGROUND

1. Field

This disclosure relates generally to multiple independent gate field effect transistors (MIGFETs) which are typically implemented as a type of FinFET, and more specifically, to electrostatic discharge (ESD) protection for MIGFETs.

2. Related Art

The use of fins in making lateral transistors such as Fin-FETs shows much promise in increasing circuit performance for a given surface area. The channel width is measured by a vertical dimension so that for a given area there is more potential current drive. The use of fins, however, does not remove the issues relating to ESD so that there remains a need for ESD protection.

Thus there is a need for providing effective ESD protection for FinFETs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an ESD protected circuit includes a multiple independent gate field effect transistor (MIGFET), which may be an output driver, connected to an input and/or output pad (I/O pad) having a first gate and a second gate controlling the same channel. A pre-driver circuit is coupled to the first gate and a hot gate bias circuit is coupled to the second gate. When an external ESD event occurs, the hot gate bias circuit applies a signal to the second gate so that the MIGFET is biased to a regime where it can withstand a higher drain to source voltage without damage. The result is enhanced protection for the MIGFET connected to the I/O pad. This is better understood by reference to the following description and the drawings.

Figure 1:
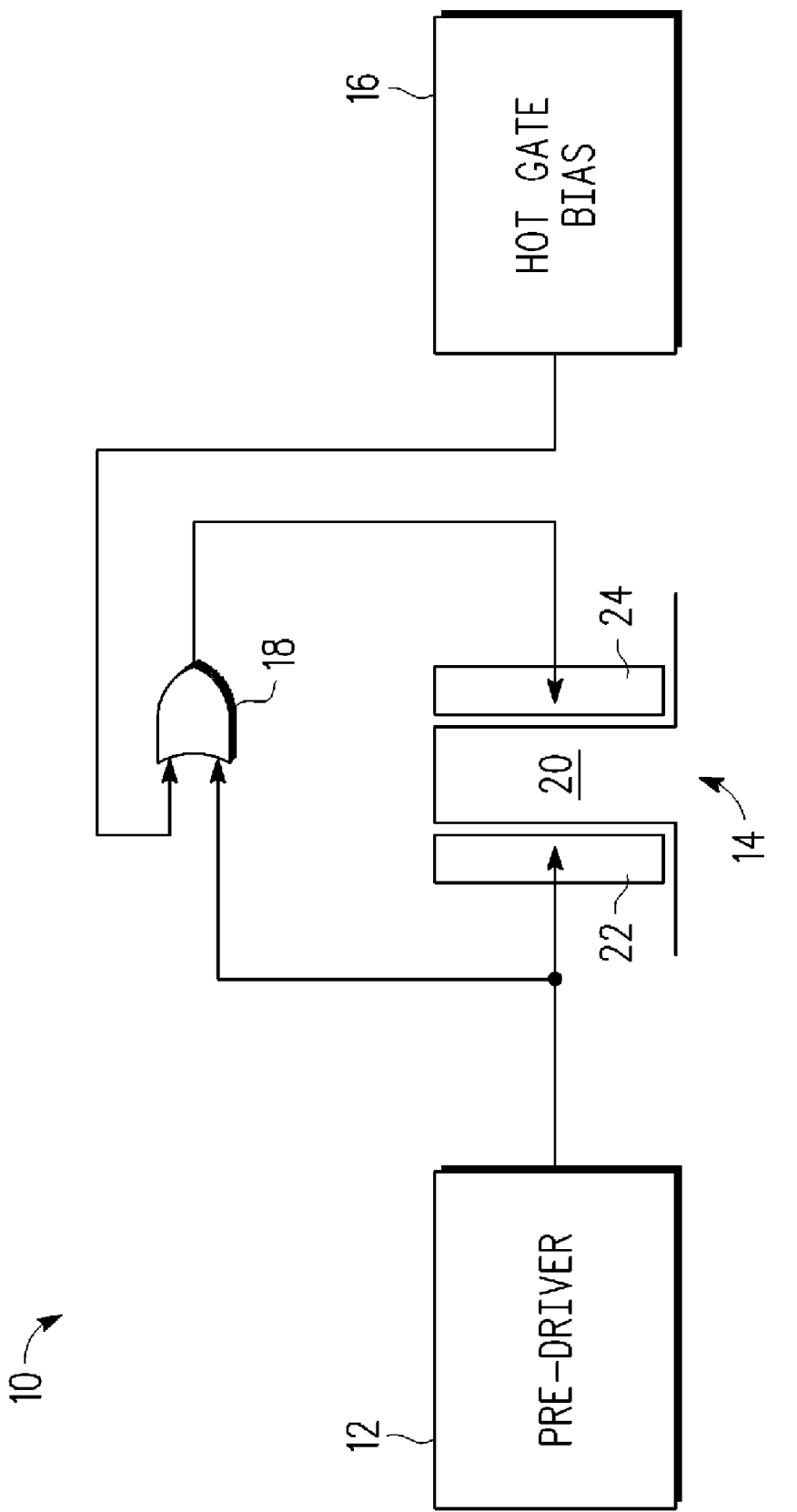
FIG. 1 is an ESD protected circuit shown as a combination block diagram and cross section.

Shown in FIG. 1 is an ESD protected circuit 10 comprising a pre-driver circuit 12, an N channel MIGFET 14, a hot gate bias circuit 16, and an OR gate 18. MIGFET 14 comprises a fin 20 that functions as channel between a source and a drain, a control gate 22 along a first side of fin 20, and a control gate 24 on a second side of fin 20. Either control gate 22 or 24 can cause MIGFET 14 to become conductive. Pre-driver circuit 12 provides a signal to control gate 22 and to a first input of OR gate 18. Hot gate bias circuit 16 has an output coupled to a second input of OR gate 18. OR gate 18 has an output connected to control gate 24. When an ESD event occurs, a situation in which a relatively high voltage occurs at an output pad connected to the drain of MIGFET 14 relative to another pad, hot gate bias circuit 16 provides an output at a logic high that ensures that OR gate 18 provides a logic high to control gate 24 thereby ensuring that MIGFET 14 is made conductive during the ESD event with a gate to source bias that is at or near the same voltage that is applied between the drain and source of MIGFET 14. It has been found that if the gate and the drain of an N channel transistor have nearly the same voltage, the channel is placed in a condition in which the drain to source breakdown voltage is higher than if the gate voltage is significantly, for example two volts, below the drain voltage. In normal operation and in the absence of an ESD event, pre-driver circuit 12 provides a signal that is connected to control gate 22 and coupled to control gate 24 through OR gate 18. For the case of MIGFET 14 being a P channel transistor, the gate 18 would be a NOR gate so that a logic low would be applied to control gate 24 in response to hot gate bias circuit 16 detecting an ESD event in which output pad is at a low voltage relative to a high voltage at another pad. In normal operation the slight delay caused by OR gate 18 may be an advantage in some situations such as a case where switching noise, also called di/dt noise, is a problem. The slight delay results in staggered conduction of the two inputs of the OR gate 18 to result in reducing the di/dt. As an alternative, OR gate 18 may not be used. In such case, pre-driver circuit 12 would only be connected to control gate 22 and hot gate bias 16 would be directly connected to control gate 24 rather than being coupled to control gate 24 through OR gate 18. In the case of MIGFET being P channel, hot gate bias circuit 16 would provide a logic low output directly to control gate 24. Hot gate bias circuit 16 thus couples a voltage to control gate 24 so that MIGFET 14 exhibits a maximum or near maximum breakdown voltage during an ESD event. In this manner the output driver MIGFET is better protected from damage.

Figure 2:
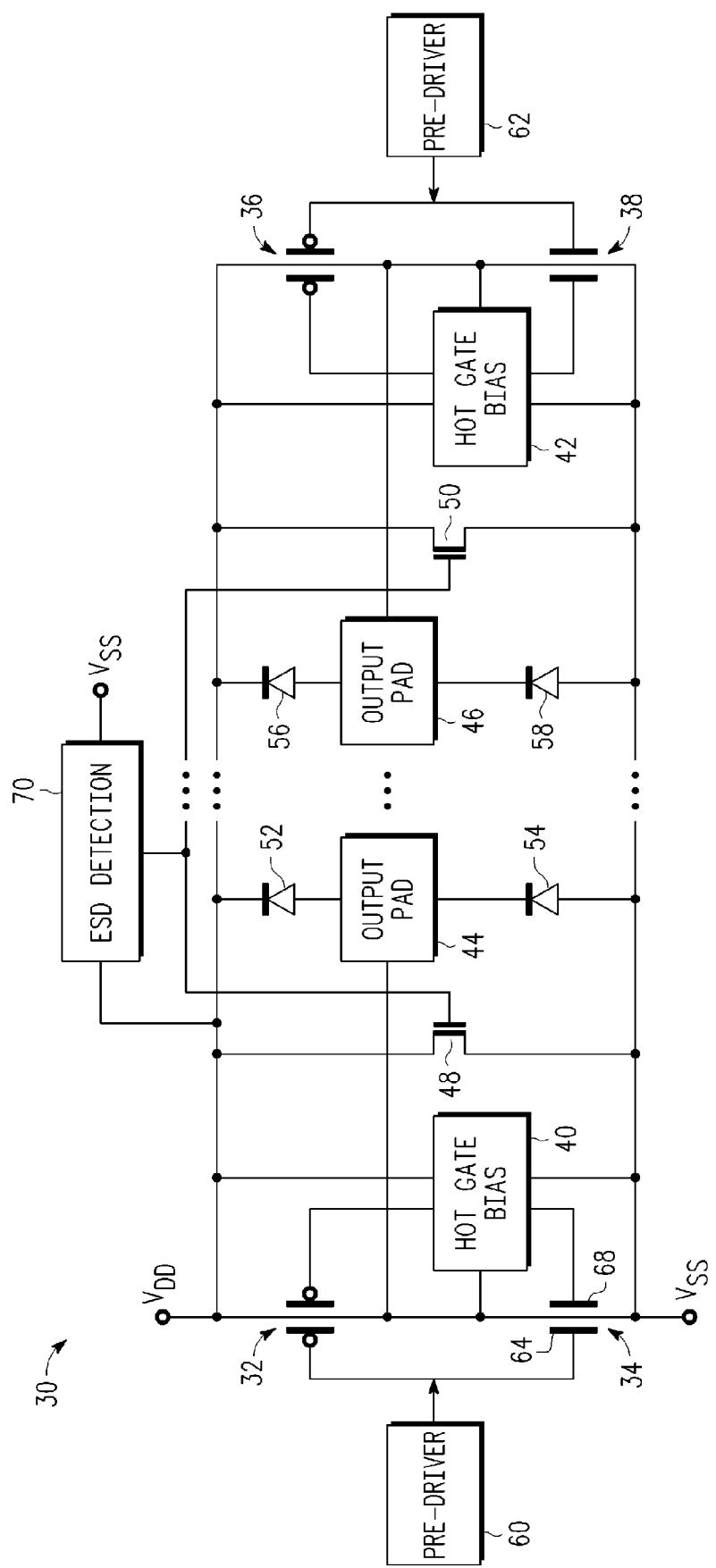
FIG. 2 is a circuit diagram showing an implementation of the ESD protected circuit of FIG. 1.

Shown in FIG. 2 is an ESD protected circuit 30 comprising a P channel MIGFET 32, an N channel MIGFET 34, a P channel MIGFET 36, an N channel MIGFET 38, a hot gate bias circuit 40, a hot gate bias circuit 42, an output pad 44, an output pad 46, an N channel transistor 48, an N channel transistor 50, a diode 52, a diode 54, a diode 56, a diode 58, an ESD detection circuit 70, a pre-driver circuit 60, and a pre-driver circuit 62. In the shown configuration the single pre-driver circuit 60 controls the gates of both the N-channel MIGFET 34 and the P-channel MIGFET 32. Alternatively, two separate pre-driver circuits may be used for the N-channel MIGFET 34 and the P-channel MIGFET 32. MIGFET 34 is also shown with a first control gate 64 and a second control gate 68. MIGFETs 32, 36, and 38 similarly have a channel and two control gates that each independently control the channel. MIGFET 32 has a source connected to a positive power supply terminal VDD, a drain connected to output pad 44, a first control gate 64 connected to an output of pre-driver circuit 60, and a second control gate 68 connected to a first output of hot gate bias circuit 40. MIGFET 34 has a source connected to a negative power supply terminal VSS that is commonly ground, a drain connected to output pad 44, a first control gate connected to the output of pre-driver circuit 60, and a second control gate connected to a second output of hot gate bias circuit 40. Hot gate bias circuit 40 is also connected to VDD, VSS, and the drains of MIGFETs 32 and 34. Hot gate bias circuit 40 couples control gate 68 to the drain of MIGFET 34 in response to detecting an ESD event in which output pad 44 receives a high voltage relative to another pad such as output pad 46. Hot gate bias circuit 40 couples the second control gate of MIGFET 32 to the drain of MIGFET 32 in response to detecting an ESD event in which another output pad such as output pad 46 receives a high voltage relative to output pad 44. During normal powered operation, hot gate bias circuit 40 provides a logic low to MIGFET 34 and a logic high to MIGFET 32. Transistor 48 has a drain connected to VDD, a source connected to VSS, and a gate connected to the output of ESD detection circuit 70. Transistor 50 has a drain connected to VDD, a source connected to VSS, and a gate connected to an output of ESD detection circuit 70. Diode 52 is connected from anode to cathode between output pad 44 to VDD. Diode 54 is connected from anode to cathode between VSS and output pad 44. Diode 56 is connected from anode to cathode between output pad 46 to VDD. Diode 58 is connected from anode to cathode between VSS and output pad 46. MIGFET 36 has a source connected to a positive power supply terminal VDD, a drain connected to output pad 46, a first control gate connected to an output of pre-driver circuit 62, and a second control gate connected to a first output of hot gate bias circuit 42. MIGFET 38 has a source connected to a negative power supply terminal VSS, a drain connected to output pad 46, a first control gate connected to the output of pre-driver circuit 62, and a second control gate connected to a second output of hot gate bias circuit 42. Hot gate bias circuit 42 is also connected to VDD, VSS, and the drains of MIGFETs 36 and 38. Hot gate bias circuit operates relative to output pad 46 and MIGFETs 36 and 38 in the same manner as hot gate bias circuit 40 operates relative to output pad 44 and MIGFETs 32 and 34. During normal powered operation, hot gate bias circuit 42 provides a logic low to MIGFET 38 and a logic high to MIGFET 36. Only output pads 44 and 46 and their associated circuitry are shown, but as indicated by the ellipses (. . .), there will be additional output pads and associated circuitry on a typical integrated circuit.

For the case of an ESD event in which a high voltage occurs at output pad 44 relative to output pad 46, diode 52 couples that voltage to VDD so that ESD detection circuit 70 and hot gate bias circuits 40 and 42 detect the ESD event. ESD detection circuit 70 responds by generating logic high signals to cause transistors 48 and 50 to become conductive. Hot gate bias circuit 40 responds by coupling control gate 68 to the drain of MIGFET 34. Hot gate bias circuit 42, which is coupled to the low voltage side of the ESD event, responds by coupling the second control gate of MIGFET 36 to the drain of MIGFET 36. Current thus flows from output pad 44 to VDD through diode 52, from VDD to VSS through transistors 48 and 50, and from VSS to output pad 46 through diode 58. While this current flow is alleviating the ESD event, MIGFET 34 is held in the high drain to source breakdown regime by having control gate 68 coupled to the drain of MIGFET 34 and MIGFET 36 is also held in the high drain to source breakdown regime by the second control gate of transistor 36 being coupled to drain of MIGFET 36. The ESD event is also partially alleviated by current flowing from output pad 44 to VSS through MIGFET 34 and current flowing from VDD to output pad 46 through MIGFET 36.

Typically P channel transistors have a higher drain to source breakdown voltage than N channel transistors so that it may not be necessary for hot gate bias circuits 40 and 42 to provide coupling between the second control gates of MIGFETS 32 and 36 and their corresponding drains. Thus, for example, for an ESD event in which there is a high voltage on output pad 44 relative to output pad 46, it may not be necessary for hot gate bias circuit 42 to couple the second control gate of MIGFET 36 to the drain of MIGFET 36. Hot gate bias circuits 40 and 42 may only provide an output to the corresponding N-channel MIGFETs 34 and 38. In another alternative configuration, separate hot gate bias circuits may be provided for each N-channel pull-down MIGFET and separate hot gate bias circuits may be for each P-channel pull-up MIGFET. In yet another alternative configuration, the hot gate bias circuit may couple to the output driver MIGFET through an OR gate, similar to the configuration shown in FIG. 1. An advantage of this configuration is that it allows the pre-driver circuit to couple to both control gates of the MIGFET. Also as an alternative, the ESD detection circuit 70 may be configured to provide a trigger signal to hot gate bias circuits 40 and 42 in response to detecting an ESD event. Hot gate bias circuits 40 and 42 in such case apply the bias voltage to a gate terminal of the respective MIGFET in response to the trigger signal.

Figure 3:
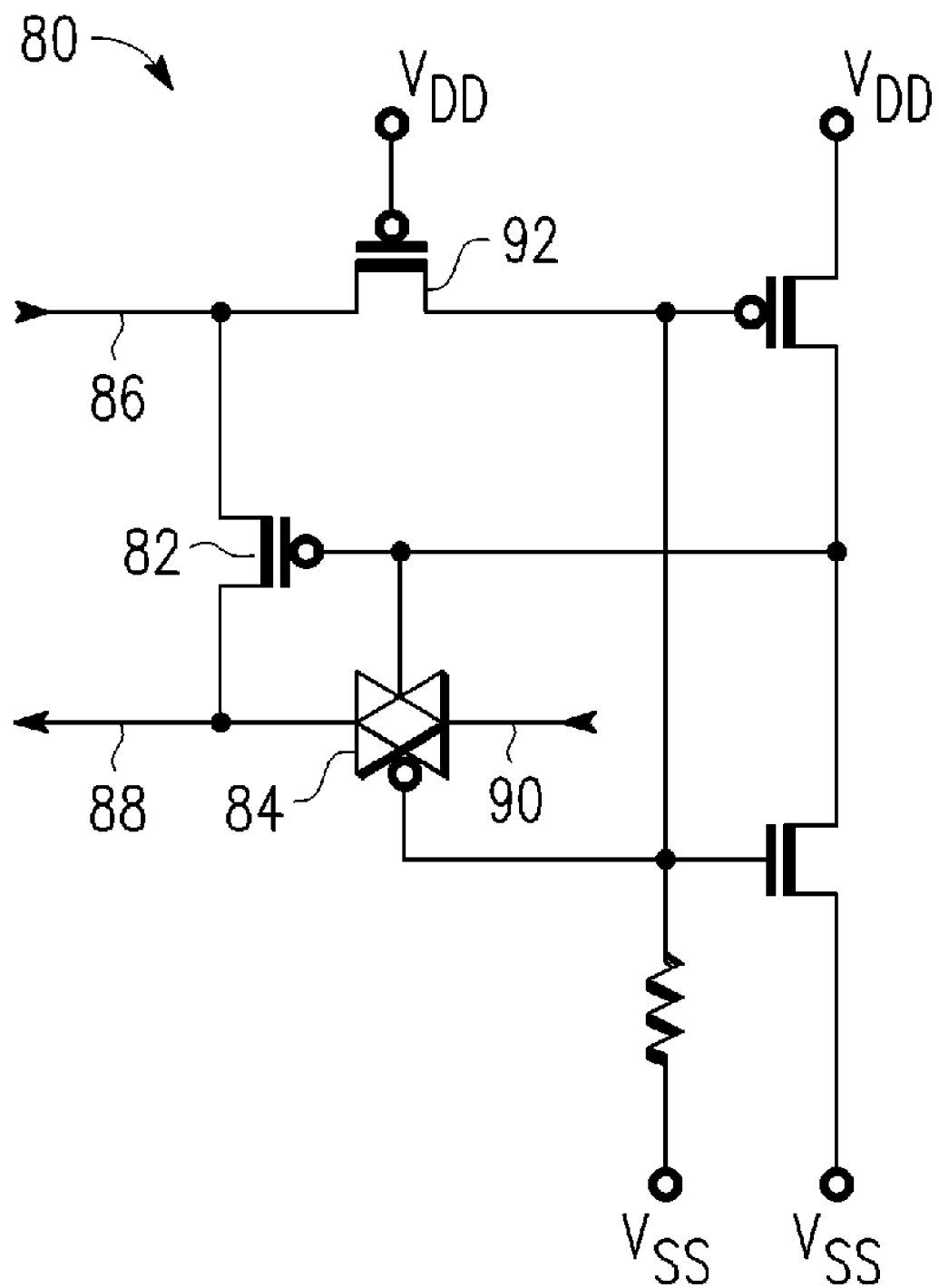
FIG. 3 is a circuit diagram showing an exemplary implementation of the OR gate and hot gate bias circuits of FIG. 1.

Shown in FIG. 3 is circuit 80 that is an exemplary implementation of the combination of OR gate 18 function and hot gate bias 16 of FIG. 1. In FIG. 3 a P-channel transistor 82 provides the control gate 24 to drain connection of MIGFET 14 during an ESD event. Input pin 86 connects to the drain of MIGFET 14 and output pin 88 connects to the gate of MIGFET 14. Transmission gate 84 couples the output of pre-driver circuit 12 at input pin 90 to control gate 24 at output pin 88 during normal operation. Note that, in the circuit of FIG. 3, an ESD event is sensed whenever the drain of MIGFET 14 exceeds VDD by more than the threshold voltage of P-channel MOSFET 92. During all normal power operation, where it is assumed that the drain of MIGFET 14 always remains at or below VDD, only the output of pre-driver circuit 12 is coupled onto the gate of MIGFET 14.

By now it should be appreciated that there has been provided an electrostatic discharge (ESD) protected circuit coupled to a power supply voltage rail that includes a multiple independent gate field effect transistor (MIGFET), a pre-driver circuit having an output, and a hot gate bias circuit. The MIGFET has a source/drain path coupled between an output pad and the power supply voltage rail, the MIGFET having a first gate terminal and a second gate terminal. The hot gate bias circuit is coupled to the first gate terminal of the MIGFET, and the output of the pre-driver circuit is coupled to the second gate terminal of the MIGFET. The hot gate bias circuit is configured to apply a bias voltage to the first gate terminal of the MIGFET during an ESD event. The hot gate bias circuit may be further configured to detect the electrostatic discharge event. The hot gate bias circuit may be configured to apply the bias voltage of a sufficient magnitude so as to make the bias voltage substantially same as a voltage at the output pad. The hot gate bias circuit may be configured to apply the bias voltage of a sufficient magnitude so as to raise a breakdown voltage associated with the MIGFET. The protected circuit may further include an electrostatic discharge (ESD) detection circuit configured to detect an electrostatic discharge event, wherein the ESD detection circuit is coupled to the hot gate bias circuit. The ESD detection circuit may be configured to provide a trigger signal to the hot gate bias circuit in response to detection of the electrostatic discharge event, such that the hot gate bias circuit applies the bias voltage to the first gate terminal of the MIGFET in response to the trigger signal. The pre-driver circuit and the hot gate bias circuit may be coupled to the first gate terminal of the MIGFET via a logic gate.

There is also described an electrostatic discharge (ESD) protected circuit coupled to a first power supply voltage rail and a second power supply voltage rail. The ESD circuit includes a first multiple independent gate field effect transistor (MIGFET) having a source/drain path coupled between an output pad and the first power supply voltage rail, wherein the first MIGFET has a first gate terminal and a second gate terminal. The ESD circuit includes a second MIGFET having a source/drain path coupled between the output pad and the second power supply voltage rail, wherein the second MIGFET has a first gate terminal and a second gate terminal. The ESD circuit includes a pre-driver circuit having an output. The ESD circuit includes a hot gate bias circuit coupled to the first gate terminal of the first MIGFET and the first gate terminal of the second MIGFET and the pre-driver circuit coupled to the second gate terminal of the first MIGFET and the second gate terminal of the second MIGFET, wherein the hot gate bias circuit is configured to apply a first bias voltage to the first gate terminal of the first MIGFET and a second bias voltage to the first gate terminal of the second MIGFET during an ESD event. The hot gate bias circuit may be configured to apply the first bias voltage of a sufficient magnitude so as to make the first bias voltage substantially same as a voltage at the output pad. The hot gate bias circuit may be further configured to detect the ESD event. The hot gate bias circuit may be configured to apply the first bias voltage of a sufficient magnitude so as to raise a breakdown voltage associated with the first MIGFET and to apply the second bias voltage of a sufficient magnitude to raise a breakdown voltage associated with the second MIGFET. The ESD protected circuit may further include an ESD detection circuit configured to detect an electrostatic discharge event, wherein the ESD detection circuit is coupled to the hot gate bias circuit. The ESD detection circuit may be configured to provide a trigger signal to the hot gate bias circuit in response to detection of the electrostatic discharge event, such that the hot gate bias circuit applies the first bias voltage to the first gate terminal of the first MIGFET and the second bias voltage to the first gate terminal of the second MIGFET in response to the trigger signal. During normal operation, the hot gate bias circuit may be configured to apply the first bias voltage of a sufficient magnitude to the first gate terminal of the first MIGFET so as to make the first bias voltage substantially same as the first power supply voltage rail. The first MIGFET may be an N channel transistor and the second MIGFET may be a P channel transistor.

There is yet also described a method in an electrostatic discharge (ESD) protected circuit, which is coupled between a first power supply voltage rail and a second power supply voltage rail, that includes a multiple independent gate field effect transistor (MIGFET) having a source/drain path coupled between an output pad and the second power supply voltage rail. The MIGFET has a first gate terminal and a second gate terminal. The method includes applying a first bias voltage of a sufficient magnitude to the first gate terminal of the MIGFET so as to make the first bias voltage substantially same as the second power supply voltage rail during normal operation. The method also includes applying a second bias voltage of a sufficient magnitude to the first gate terminal of the MIGFET so as to make the second bias voltage substantially same as a voltage at the output pad during an ESD event. The steps of applying may be further characterized as using a bias circuit for applying the first and second bias voltages and the method may further include using the bias circuit to detect the ESD event. The method may further include selecting the second bias voltage so as to raise a breakdown voltage associated with the MIGFET. The method may further comprise providing a trigger signal to the hot gate bias circuit in response to detection of the electrostatic discharge event, such that the hot gate bias circuit applying the second bias voltage to the first gate terminal of the MIGFET in response to the trigger signal.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example transistors 48 and 50 are described as N channel transistors but some other clamping operation may be used. Also diodes 52, 54, 56, and 58 may be diode-connected transistors and be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electrostatic discharge (ESD) protected circuit coupled to a power supply voltage rail, comprising: a multiple independent gate field effect transistor (MIGFET) having a source/drain path coupled between an output pad and the power supply voltage rail, the MIGFET having a first gate terminal and a second gate terminal, wherein the MIGFET functions as an output driver;
   a pre-driver circuit having an output coupled to the second gate terminal of the MIGFET, wherein the pre-driver circuit controls the second gate terminal; and
   a hot gate bias circuit coupled to the first gate terminal of the MIGFET, wherein the hot gate bias circuit is configured to apply a bias voltage to the first gate terminal of the MIGFET during an ESD event.

2. The ESD protected circuit of claim 1, wherein the hot gate bias circuit is further configured to detect the electrostatic discharge event.

3. The ESD protected circuit of claim 1, wherein the hot gate bias circuit is configured to apply the bias voltage of a sufficient magnitude so as to make the bias voltage substantially same as a voltage at the output pad.

4. The ESD protected circuit of claim 1, wherein the hot gate bias circuit is configured to apply the bias voltage of a sufficient magnitude so as to raise a breakdown voltage associated with the MIGFET.

5. The ESD protected circuit of claim 1 further comprising an electrostatic discharge (ESD) detection circuit configured to detect an electrostatic discharge event, wherein the ESD detection circuit is coupled to the hot gate bias circuit.

6. The ESD protected circuit of claim 5, wherein the ESD detection circuit is configured to provide a trigger signal to the hot gate bias circuit in response to detection of the electrostatic discharge event, such that the hot gate bias circuit applies the bias voltage to the first gate terminal of the MIGFET in response to the trigger signal.

7. An electrostatic discharge (ESD) protected circuit coupled to a first power supply voltage rail and a second power supply voltage rail, comprising:
  a first multiple independent gate field effect transistor (MIGFET) having a source/drain path coupled between an output pad and the first power supply voltage rail, wherein the first MIGFET has a first gate terminal and a second gate terminal and functions as an output driver;
  a second MIGFET having a source/drain path coupled between the output pad and the second power supply voltage rail, wherein the second MIGFET has a first gate terminal and a second gate terminal and functions as an output driver;
  a pre-driver circuit having an output coupled to the second gate terminal of the first MIGFET and the second gate terminal of the second MIGFET, wherein the pre-driver circuit controls the second gate terminal of the first MIGFET and the second gate terminal of the second MIGFET; and
  a gate bias circuit coupled to the first gate terminal of the first MIGFET and the first gate terminal of the second MIGFET, wherein the gate bias circuit is configured to apply a first bias voltage to the first gate terminal of the first MIGFET and a second bias voltage to the first gate terminal of the second MIGFET during an ESD event.

8. The ESD protected circuit of claim 7, wherein the gate bias circuit is further configured to detect the ESD event.

9. The ESD protected circuit of claim 7, wherein the gate bias circuit is configured to apply the first bias voltage of a sufficient magnitude so as to make the first bias voltage substantially same as a voltage at the output pad.

10. The ESD protected circuit of claim 7, wherein the gate bias circuit is configured to apply the first bias voltage of a sufficient magnitude so as to raise a breakdown voltage associated with the first MIGFET and to apply the second bias voltage of a sufficient magnitude to raise a breakdown voltage associated with the second MIGFET.

11. The ESD protected circuit of claim 7 further comprising an ESD detection circuit configured to detect an electrostatic discharge event, wherein the ESD detection circuit is coupled to the gate bias circuit.

12. The ESD protected circuit of claim 11, wherein the ESD detection circuit is configured to provide a trigger signal to the gate bias circuit in response to detection of the electrostatic discharge event, such that the gate bias circuit applies the first bias voltage to the first gate terminal of the first MIGFET and the second bias voltage to the first gate terminal of the second MIGFET in response to the trigger signal.

13. The ESD protected circuit of claim 7, wherein, during normal operation, the gate bias circuit is configured to apply the first bias voltage of a sufficient magnitude to the first gate terminal of the first MIGFET so as to make the first bias voltage substantially same as the first power supply voltage rail.

14. The ESD protected circuit of claim 7, wherein the first MIGFET is an n-type transistor and the second MIGFET is a p-type transistor.

15. A method in an electrostatic discharge (ESD) protected circuit, coupled between a first power supply voltage rail and a second power supply voltage rail, comprising a multiple independent gate field effect transistor (MIGFET) having a source/drain path coupled between an output pad and the second power supply voltage rail, the MIGFET having a first gate terminal and a second gate terminal, the method comprising:
  controlling the second gate terminal of the MIGFET with a pre-driver circuit, wherein the MIGFET functions as an output driver;
  applying a first bias voltage of a sufficient magnitude to the first gate terminal of the MIGFET so as to make the first bias voltage substantially same as the second power supply voltage rail during normal operation; and
  applying a second bias voltage of a sufficient magnitude to the first gate terminal of the MIGFET so as to make the second bias voltage substantially same as a voltage at the output pad during an ESD event.

16. The method of claim 15, wherein the steps of applying are further characterized as using a bias circuit for applying the first and second bias voltages, further comprising using the bias circuit to detect the ESD event.

17. The method of claim 15 further comprising selecting the second bias voltage so as to raise a breakdown voltage associated with the MIGFET.

18. The method of claim 15 further comprising providing a trigger signal to a hot gate bias circuit in response to detection of the electrostatic discharge event, such that the hot gate bias circuit applying the second bias voltage to the first gate terminal of the MIGFET in response to the trigger signal.

* * * * *